United States Patent [19]
Dietze et al.

[11] Patent Number: 5,964,948
[45] Date of Patent: Oct. 12, 1999

[54] EXHAUST INSERT FOR BARREL-TYPE EPITAXIAL REACTORS

[75] Inventors: Gerald Roger Dietze; Dena Carol Anderson Mitchell, both of Portland, Oreg.

[73] Assignee: SEH America, Inc., Vancouver, Wash.

[21] Appl. No.: 09/135,352

[22] Filed: Aug. 17, 1998

[51] Int. Cl.[6] .................................................. C23C 16/00
[52] U.S. Cl. ............................................................ 118/715
[58] Field of Search ............................................. 118/715

[56] References Cited

U.S. PATENT DOCUMENTS 3,796,182   3/1974   Rosler .
4,421,786  12/1983   Mahajan et al. .
4,976,217  12/1990   Frijlink .

OTHER PUBLICATIONS

Applied Materials, Inc. Manual, *Precision 7700™ Maintenance*, Preventive Maintenance Procedures, Jul. 1994, pp. 3–27.

*Primary Examiner*—Richard Bueker
*Attorney, Agent, or Firm*—Alston & Bird LLP

[57] ABSTRACT

The exhaust insert is designed to reduce the eddy currents created within the reaction chamber so as to provide more even and predictable etching and/or epitaxial deposition. The exhaust insert is at least partially inserted into the exhaust port of the epitaxial barrel reactor. In particular, the exhaust insert includes an extension member that is adapted to be at least partially inserted within the exhaust port. The exhaust insert also includes an inlet member that extends beyond the exhaust port and into the barrel reactor. The inlet member is angled relative to the extension member so as to support the exhaust insert within the exhaust port of the barrel reactor. The angled design of the exhaust insert also serves to essentially scoop the exhaust gases into the exhaust port, thereby significantly reducing eddy current flow within the reaction chamber.

18 Claims, 4 Drawing Sheets

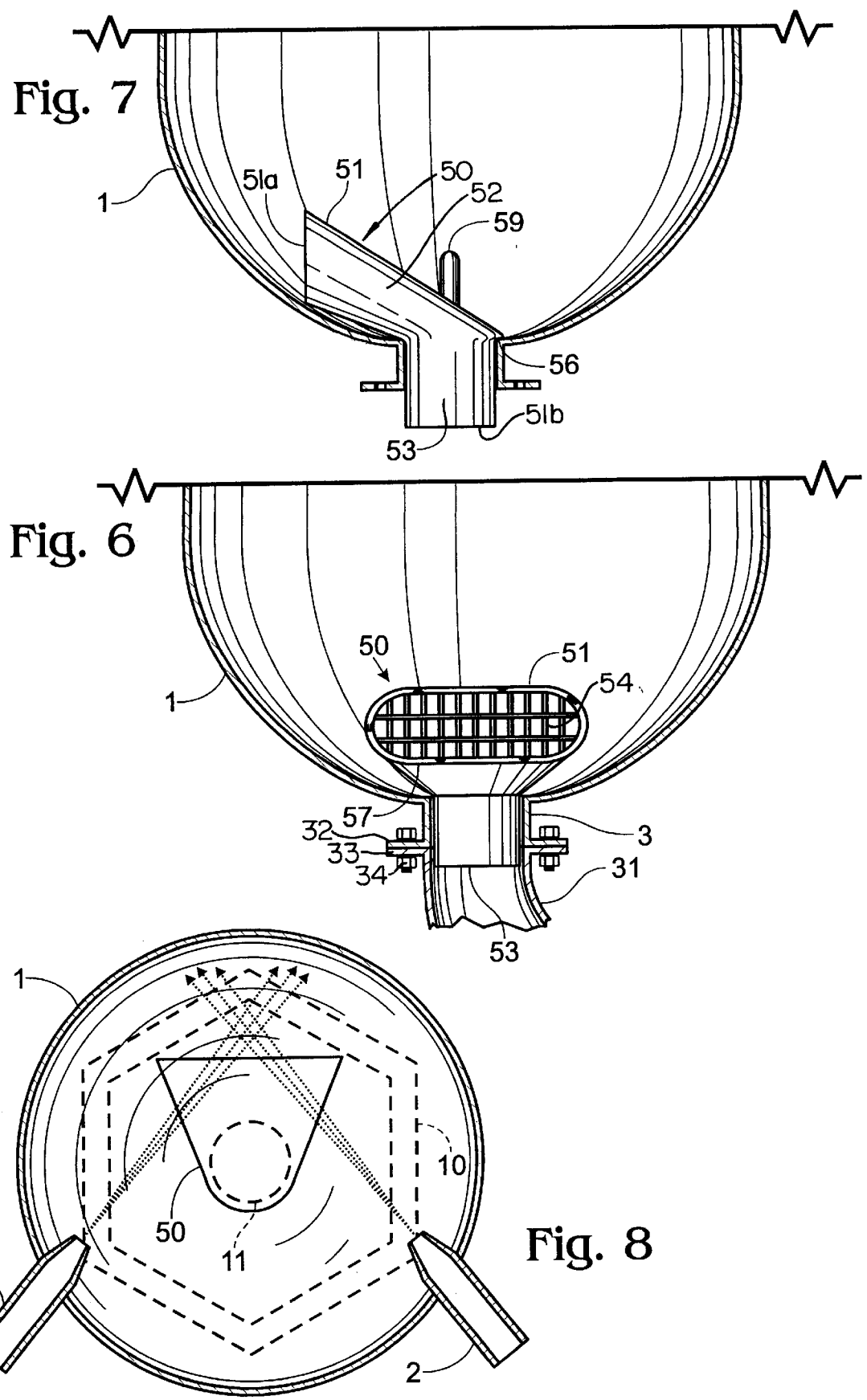

5,964,948

EXHAUST INSERT FOR BARREL-TYPE EPITAXIAL REACTORS

BACKGROUND OF THE INVENTION

Epitaxy is the oriented crystalline growth between two crystalline solid surfaces wherein the surface of one crystal has suitable positions for deposition of a second crystal. More typically, epitaxy refers to the growth of a crystalline layer upon a crystalline substrate. One common technique for epitaxial growth is chemical vapor deposition (CVD). In the microelectronics industry, for example, crystalline silicon is epitaxially grown upon silicon wafer substrates in a heated reactor.

As shown in FIG. 1, a conventional epitaxial reactor is a barrel reactor defining a CVD chamber in which a barrel-like holder or susceptor is mounted so as to rotate about its vertical axis. Semiconductor wafers are placed in recessed pockets defined by the susceptor so as to be held at a slight angle, such as 2°, from vertical. As such, the susceptor holds the wafers in a manner which permits the wafers to have maximum surface area exposure to the chemical vapor while utilizing the force of gravity to retain the wafers within the pockets. A barrel reactor also generally defines gas inlets near the top of the CVD chamber and an exhaust port near the bottom of the CVD chamber such that gas entering the CVD chamber via the gas inlets generally flows downwardly over the wafers prior to exiting the CVD chamber via the exhaust port.

Unfortunately, eddy currents are oftentimes created within conventional reactors. As known to those skilled in the art, eddy currents can cause inhomogeneous silicon deposition upon the wafer substrates during epitaxial deposition of silicon due to the uncontrolled number of passes that the gas makes over the wafers. Likewise, in instances in which the reactor is used to clean the wafers prior to the epitaxial deposition of silicon, the eddy currents also cause uneven and unpredictable etching of the wafer substrates. There is therefore a need for epitaxial barrel reactors which create fewer eddy currents in order to permit the barrel reactors to operate more reliably.

SUMMARY OF THE INVENTION

The exhaust insert of the present invention facilitates the flow of exhaust gas into the exhaust system of a barrel reactor in order to reduce eddy currents within the reaction chamber of the barrel reactor in comparison to conventional barrel reactors, thereby providing more even and predictable etching and/or epitaxial deposition. According to the present invention, the exhaust insert is at least partially inserted into the exhaust port of the epitaxial barrel reactor. In particular, the exhaust insert includes an inlet member and an opposed extension member that open through inlet and outlet ports, respectively. The extension member is adapted to be at least partially inserted within the exhaust port defined by the barrel reactor. In contrast, the inlet member of the exhaust insert extends beyond the exhaust port and into the barrel reactor. As such, gas flowing through the reaction chamber of the epitaxial barrel reactor is scooped through the exhaust insert and into the exhaust port of the reaction chamber without creating eddy currents of the magnitude of the eddy currents created by conventional barrel reactors.

The housing of the exhaust insert is preferably angled such that the inlet member is disposed at an angle relative to the extension member. In other words, the inlet member and the extension member define respective longitudinal axes that are nonparallel. Since portions of the barrel reactor adjacent to the exhaust port slope at a predetermined angle relative to the exhaust port, the inlet member is preferably angled relative to the extension member at the same predetermined angle. As such, the angled housing and, more particularly, the angled inlet member supports the exhaust insert within the exhaust port of the barrel reactor. In addition to the angled housing, the exhaust insert can include additional means for supporting the exhaust insert such that the inlet member extends beyond the exhaust port and into the barrel reactor. For example, the means for supporting the exhaust insert can include at least one support flange that is adapted to engage an interior surface of the barrel reactor.

The exhaust insert also preferably includes a grill that at least partially covers the inlet port of the housing to prevent at least some of the wafer fragments from entering the exhaust port of the barrel reactor. As such, the exhaust insert prevents the exhaust port from becoming clogged or otherwise blocked with wafer fragments. By continuing to permit the free flow of gas through the exhaust insert and into the exhaust port of the barrel reactor, the exhaust insert reduces the eddy currents produced within the barrel reactor, thereby improving the consistency of the etching and epitaxial deposition processes.

Therefore, the construction and orientation of the exhaust insert within the barrel reactor facilitates the flow of exhaust gas into the exhaust insert and, in turn, into the exhaust system of the barrel reactor. As such, the exhaust insert of the present invention reduces eddy currents within the barrel reactor such that the etching and epitaxial deposition processes conducted within the barrel reactor are performed in a more consistent and reliable manner. By preventing wafer fragments from clogging the exhaust port of the epitaxial barrel reactor, the exhaust insert of the present invention also permits the barrel reactor to remain in service for longer extended periods of time, thereby increasing the efficiency of the etching and epitaxial deposition processes.

BRIEF DESCRIPTION OF THE DRAWINGS

FIG. 6 is a front view of an exhaust insert according to one embodiment of the present invention that is installed within the exhaust port of an epitaxial barrel reactor.

FIG. 7 is a side view of the installed exhaust insert of FIG. 6.

FIG. 8 is a top cross-sectional view of the epitaxial barrel reactor of FIG. 6 which illustrates the direction in which gas is injected into the reaction chamber.

DETAILED DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Figure 1:
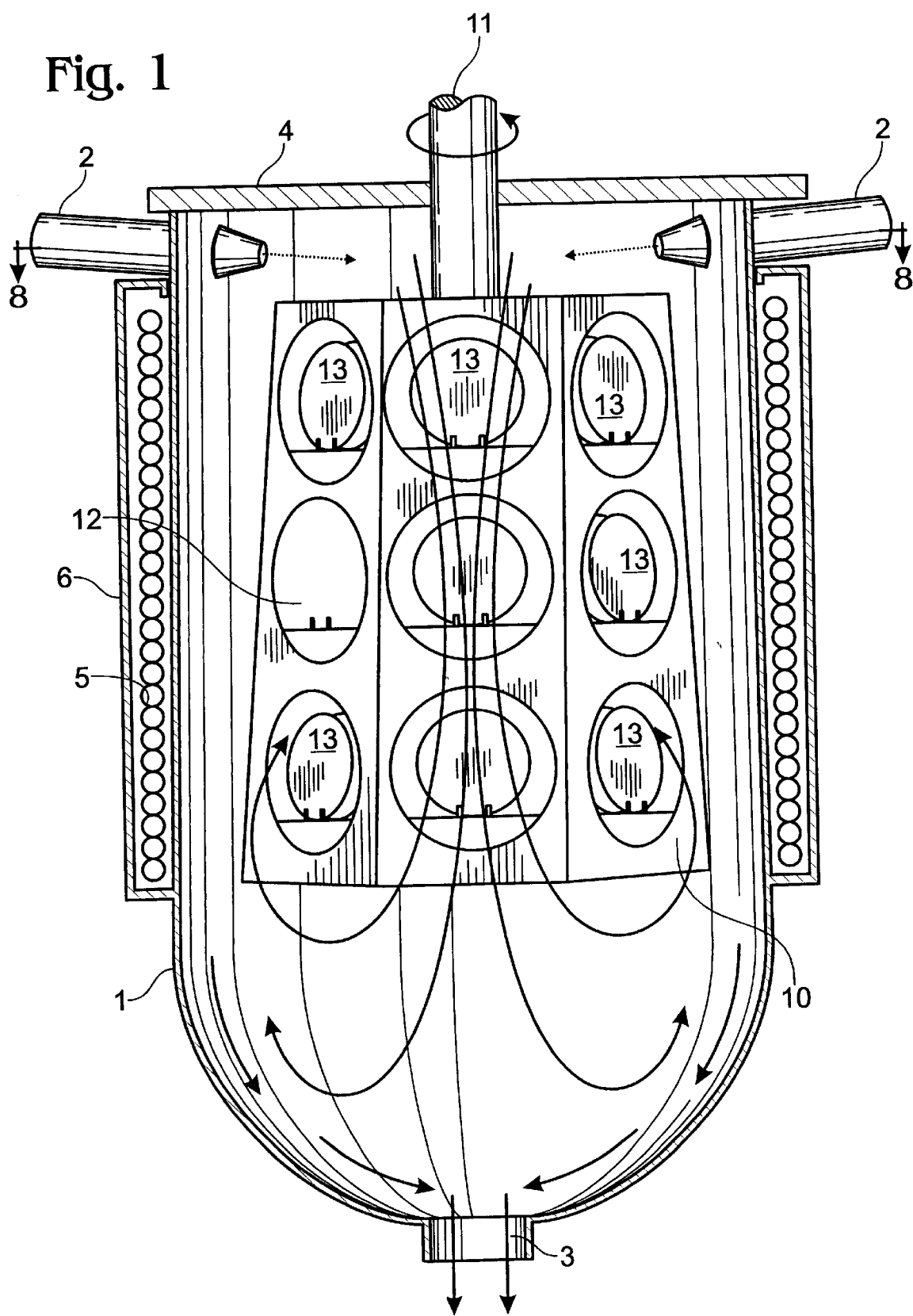
FIG. 1 is a schematic cross-sectional view of a conventional epitaxial barrel reactor.

As shown in FIG. 1, a conventional epitaxial barrel reactor includes a bell-shaped reaction chamber 1 that is preferably made of quartz. The reaction chamber defines at least one reactant gas inlet 2 and at least one exhaust port 3. As illustrated, the gas inlets are generally defined in an upper portion of the reaction chamber while the exhaust port is generally defined in a lower portion of the reaction chamber. As such, the gas that is introduced via the gas inlets generally flows downwardly through the reaction chamber and is exhausted through the exhaust port.

Figure 2:
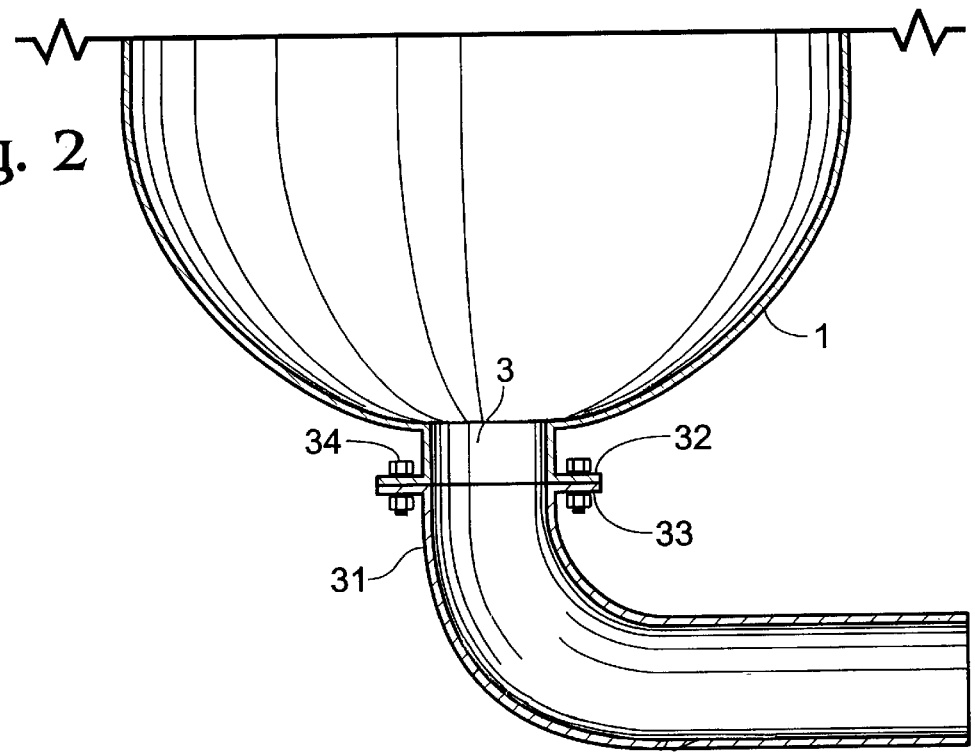
FIG. 2 is a schematic cross-sectional view of the bottom portion of the conventional reactor of FIG. 1 which illustrates a number of wafer fragments disposed within the exhaust duct.

As shown in FIG. 2, an exhaust duct 31 is generally secured to the exhaust port 3. For example, both the exhaust duct and the exhaust port can include a respective flange 32, 33 that can be secured by fastening means 34, such as rivets or nuts and bolts.

The barrel reactor also includes means for heating the reaction chamber 1. Although a variety of means can be employed to heat the reaction chamber such as radio frequency energy sources, radiant energy sources that operate in the ultraviolet, visible or infrared bands, or resistance heating sources, the barrel reactor of the illustrated embodiment includes infrared lamps 5 and a surrounding reflector 6 for heating the reaction chamber.

As illustrated in FIG. 1, the upper portion of the reaction chamber 1 is generally covered with a top plate 4. The barrel reactor also includes a susceptor 10, such as a polyhedron susceptor, suspended within the reaction chamber. Typically, the susceptor is suspended by means of a rotatable shaft 11 that passes through a correspondingly shaped and sized opening that is defined by the top plate. As such, the susceptor can be rotated by applying a rotational force to the shaft, such as by means of a motor or the like. As illustrated in FIG. 1, the susceptor defines a number of recessed pockets 12 for holding and supporting a plurality of wafers 13, such as silicon wafers.

In order to epitaxially grow a material layer upon the wafers 13, reactant gases as known to those skilled in the art are introduced through the gas inlets 2. In order to deposit silicon, for example, the reactant gas may include any of the known silicon-containing compounds, such as $SiH_4$, $SiH_2Cl_2$, $SiHCl_3$ or $SiCl_4$. As also known to those skilled in the art, a carrier gas, such as hydrogen or helium, is also generally introduced through the gas inlets in order to transport the reactant gas into and through the reactor chamber 1. Although not necessary, the carrier gas can also contain minor amounts of gaseous dopant, such as $AsH_3$, $PH_3$ or $B_2H_6$.

Prior to epitaxially growing a material layer upon the wafers 13, however, the wafers can be etched to create the hydrophobic surface desirable during epitaxial deposition by removing a thin layer of silicon from the wafers and/or by removing foreign matter or any crystallographic defects. In this instance, etching gases, such as anhydrous HCl, may be introduced through the gas inlets 2 prior to beginning the epitaxial growth process. In addition, purge gases are generally introduced into the reaction chamber 1 at several points in the epitaxial growth process in order to purge the reaction chamber of any reactive component gases. For example, purge gases are generally introduced prior to the introduction of the etching gases, between the etching and epitaxial growth processes, and following the epitaxial growth process.

In operation, eddy currents within the barrel reactor should be minimized to reduce inhomogeneous epitaxial deposition during deposition procedures and to prevent uneven and unpredictable etching during cleaning procedures. Accordingly, an exhaust insert 50 is therefore provided according to the present invention which significantly reduces eddy currents in comparison to conventional barrel reactors. As described below, the exhaust insert of the present invention reduces eddy currents by essentially scooping the exhaust gases into the exhaust port 3 and by reducing the number of wafer fragments which accumulate in or near the exhaust port that would otherwise at least partially block the exhaust port, as described below.

Figure 3:
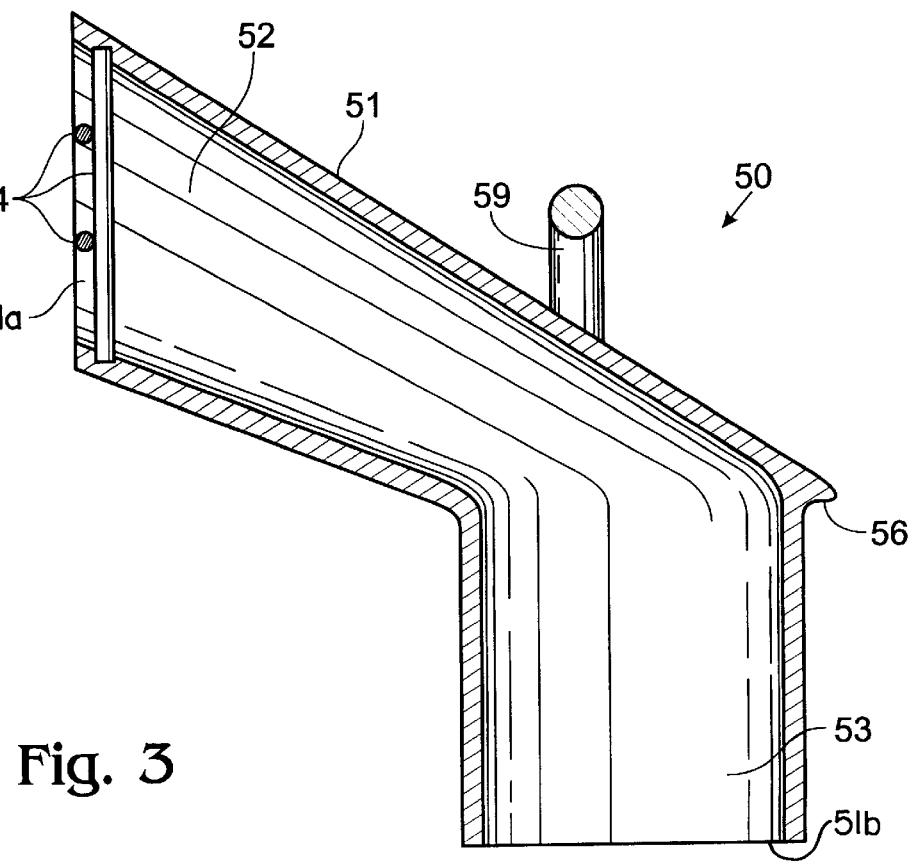
FIG. 3 is a side cross-sectional view of an exhaust insert according to one embodiment of the present invention.

As shown in FIG. 3, the exhaust insert 50 includes a housing 51, typically formed of quartz, that extends between an inlet port 51a and an opposed outlet port 51b. In turn, the housing includes an inlet member 52 that opens through and is adjacent the inlet port. Likewise, the housing includes an extension member 53 that opens through and is adjacent the outlet port. The exhaust insert also includes a grill 54 that is secured to one end of the housing so as to at least partially cover the inlet port.

As shown in FIGS. 6 and 7, the extension member 53 preferably extends into the exhaust port 3 and at least partially into the exhaust duct 31 once the exhaust insert 50 has been installed. Thus, the exterior dimensions of the extension member are preferably only slightly smaller than the internal dimensions of the exhaust port and the exhaust duct such that the extension member will fit snugly therein. In addition, the extension member preferably has the same shape, i.e., cylindrical, as the exhaust port and the exhaust duct. While the inlet member 52 can have a variety of shapes and configurations without departing from the spirit and scope of the present invention, the inlet member is preferably flared outwardly such that the inlet port 51a has a larger cross-sectional size then medial portions of the housing 51, thereby further facilitating the flow of gas into and through the exhaust insert. For example, the inlet member of the illustrated embodiment has a cross-sectional shape that is roughly trapezoidal.

Figure 4:
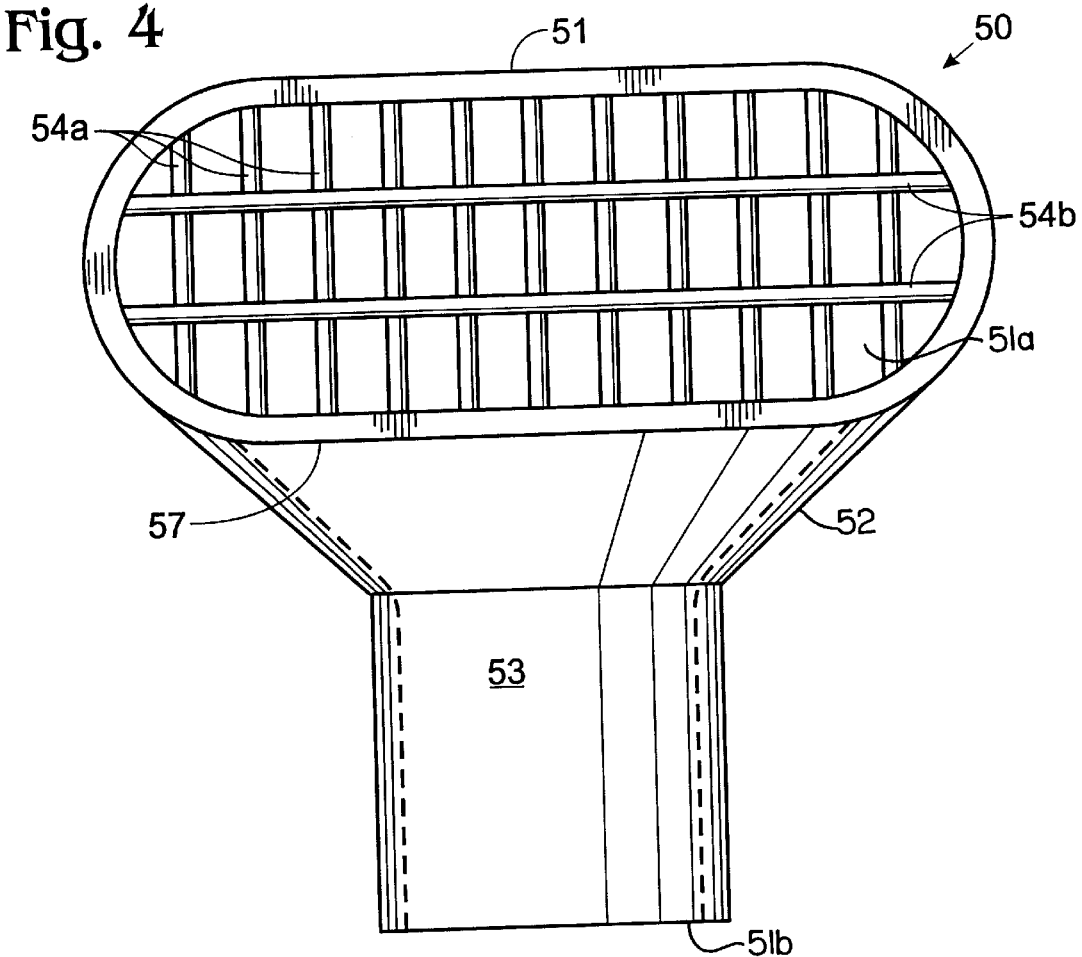
FIG. 4 is a front view of the exhaust insert of FIG. 3.

As shown in FIG. 4, the exhaust insert 50 of one embodiment includes a grill 54 comprised of a number of vertical rods 54a and horizontal rods 54b that intersect in a gridlike configuration. It is to be understood, however, that the exhaust insert can include virtually any configuration of a grill that does not unduly restrict the flow of spent reactant gases will suffice. In this regard, the vertical and horizontal rods are preferably quite thin so as to permit the spent reactant gases to flow through the grill in a relatively unrestricted manner. Further, the openings defined by the vertical and horizontal rods can be of any size, but are typically less than 1 square inch.

The exhaust insert 50 also includes means for supporting the exhaust insert such that the inlet member 52 extends beyond the exhaust port 3 and into the reaction chamber 1 of the barrel reactor. Although a variety of means can be utilized to support the exhaust insert without departing from the spirit and scope of the present invention, the exhaust insert of one advantageous embodiment includes at least one support flange 56 that is adapted to engage an interior surface of the barrel reactor. As shown in FIGS. 3 and 7, for example, the support flange can include a rib that extends outwardly from a medial portion of the housing 51 for engaging the interior surface of the barrel reactor.

As also illustrated in FIGS. 3 and 7, the housing 51 is preferably angled. In this regard, the inlet member 52 can be disposed at an angle relative to the extension member 53. Since interior portions of the barrel reactor adjacent to the exhaust port 3, i.e., the floor of the reaction chamber, slope upwardly at a predetermined angle, the inlet member is preferably angled relative to the extension member at the same predetermined angle. As such, the inlet member can rest upon the upwardly sloping floor of the reaction chamber 1 once the extension member has been inserted into the exhaust port, thereby further supporting the exhaust insert such that the inlet member extends beyond the exhaust port and into the reaction chamber of the barrel reactor.

Although the means for supporting the exhaust insert 50 of the illustrated embodiment includes both an angled housing 51 and a support flange 56, the exhaust insert need only include a single means for supporting the exhaust insert. In embodiments of the exhaust insert that do include both the angled housing and the support flange, the exhaust insert is preferably constructed such that the support flange extends outwardly from the housing in a direction substantially opposite the direction in which the inlet member 52 is angled relative to the extension member 53. In addition, the support flange preferably extends outwardly from that portion of the housing that defines the vertex of the angle between the inlet member and the extension member. As such, the exhaust insert will be securely supported relative to the barrel reactor.

In addition to at least partially supporting the exhaust insert 50, the angled inlet member 52 also contributes to the reduction in the accumulation of wafer fragments in the vicinity of the inlet port 51a. In this regard, a few wafers 13 may become dislodged from the recessed pockets 12 defined by the susceptor 10 and fall to the bottom of the reaction chamber 1 during the etching and epitaxial growth processes. These wafers will typically break into a number of fragments. According to the present invention, however, a number of the wafers 13 that fall from the susceptor 10 land upon the upwardly facing surface of the inlet member. As such, the resulting wafer fragments oftentimes accumulate about the inlet member at locations removed from the inlet port, thereby further facilitating the removal of exhaust gases via the exhaust insert.

Figure 5:
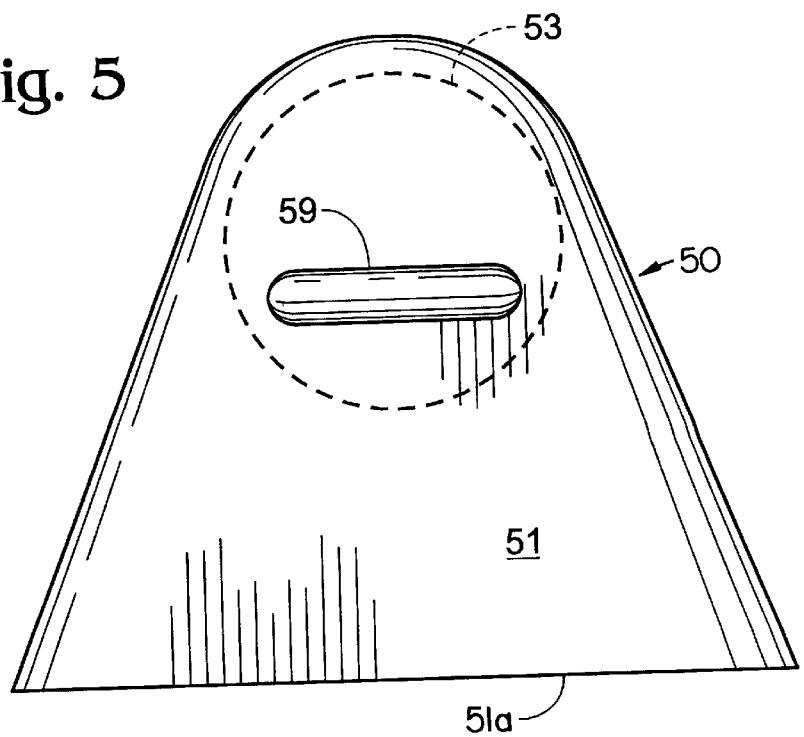
FIG. 5 is a top view of the exhaust insert of FIG. 3.

As illustrated in FIGS. 3, 5 and 7, the exhaust insert 50 of one advantageous embodiment also includes a lug 59 extending outwardly from the housing 51. In particular, the lug is preferably positioned such that once the exhaust insert has been installed within the exhaust port 3, the lug will extend upwardly toward upper portions of the barrel reactor. As such, the lug facilitates both placement and removal of the exhaust insert from the reaction chamber 1 since the lug may be readily grasped during inserting and removing the exhaust insert.

During either an etching or epitaxial deposition process, gas is introduced via the gas inlets 2, flows downwardly through the reaction chamber so as to pass over the wafers 13, and is exhausted through the exhaust insert 50 into the exhaust port 3. As shown in FIG. 8, for example, the gas inlets are generally defined in one side of reaction chamber 1 such that the gases introduced via the gas inlets impinge predominantly on the side of the reaction chamber opposite the inlets prior to passing downwardly over the wafers. As also seen in FIG. 8, the exhaust insert 50 is preferably oriented so that the inlet port faces the side of the reaction chamber upon which the gases introduced via the gas inlets impinge.

During an etching or epitaxial deposition process, the inlet port 51a of the exhaust insert 50 receives the exhaust gases once the gases have passed over the wafers 13. The exhaust gases flow through the housing 51 and are scooped into the exhaust duct 31. By permitting the exhaust gases to freely enter the exhaust insert and, in turn, the exhaust duct, the exhaust insert substantially reduces the eddying of the gases within the reaction chamber 1, thereby permitting the etching and epitaxial deposition processes to be performed in a more consistent and reliable manner. In particular, by essentially scooping the exhaust gases into the exhaust port, the angled construction of the exhaust insert and the relative position of the inlet port of the exhaust insert within the reaction chamber is believed to facilitate single pass reactive gas flow through the reaction chamber. By permitting the etching and epitaxial deposition processes to be performed in a more consistent and reliable manner, the exhaust insert of the present invention permits the barrel reactor to remain in service for longer extended periods of time, thereby increasing the efficiency of the etching and epitaxial deposition processes.

While the exhaust gases are permitted to flow freely through the exhaust insert 50 and into the exhaust duct 31, the grill 54 prevents at least some wafer fragments that could potentially clog the exhaust port 3 or exhaust duct from entering the exhaust insert and, in turn, from entering the exhaust system of the epitaxial reactor. By preventing at least some of the wafer fragments from entering the exhaust port 3, the exhaust insert 50 of the present invention also permits the wafer fragments to be easily removed from the bottom portion of the reaction chamber 1 so as to further minimize the down time of the reactor. In this instance, the shaft 11 of susceptor 10 is disengaged and the top plate 4 is removed together along with the susceptor. The larger wafer fragments can then be removed from around the exhaust insert 50. The exhaust insert can then be removed through the open top of the reaction chamber by grasping the lug 59 which upwardly from the housing 51. Once the exhaust insert, the exhaust port and the exhaust duct 31 have been cleans and any wafer fragments have been removed therefrom, the exhaust insert can be reinserted by holding the lug while the exhaust insert is lowered through the reaction chamber and is inserted within the exhaust port 3. Thereafter, the barrel reactor can be reassembled and flushed with an inert gas prior to resuming operation.

In the drawings and the specification, there has been set forth a preferred embodiment of the invention and, although specific terms are employed, the terms are used in a generic and descriptive sense only and not for purpose of limitation, the scope of the invention being set forth in the following claims.

That which is claimed is:

1. An exhaust insert for an epitaxial barrel reactor, the exhaust insert comprising:

an angled housing having an inlet member and an extension member adapted to be at least partially inserted within an exhaust port of the barrel reactor, wherein the inlet member is angled relative to the extension member so as to support the exhaust insert relative to the exhaust port of the barrel reactor such that the inlet member extends beyond the exhaust port and into the barrel reactor, wherein the inlet member and the extension member define respective longitudinal axes which are nonparallel, and wherein said housing also defines inlet and outlet ports at opposed ends thereof with the extension member opening through the outlet port and the inlet member opening through the inlet port; and a grill at least partially covering the inlet port of said housing.

2. An exhaust insert according to claim 1 wherein the inlet member is flared outwardly such that the inlet port has a larger cross-sectional size than medial portions of said housing.

3. An exhaust insert according to claim 1 wherein said means for supporting the exhaust insert comprises at least one support flange that is adapted to engage an interior surface of the barrel reactor.

4. An exhaust insert according to claim 3 wherein said support flange comprises a rib extending outwardly from a medial portion of said housing.

5. An exhaust insert according to claim 1 further comprising a lug extending outwardly from said housing for removing the exhaust insert from the exhaust port of the barrel reactor.

6. An exhaust insert for an epitaxial barrel reactor having an exhaust port, wherein portions of the barrel reactor adjacent the exhaust port slope at a predetermined angle relative to the exhaust port, and wherein the exhaust insert comprises:

an angled housing having an extension member adapted to be at least partially inserted within the exhaust port of the barrel reactor, said housing also having an inlet member in fluid communication with said extension member and disposed at a predetermined angle relative to said extension member that corresponds to the predetermined angle of slope for portions of the barrel reactor adjacent the exhaust port to thereby support the exhaust insert such that said inlet member extends beyond the exhaust port and into the barrel reactor, said housing also defining inlet and outlet ports at opposed ends thereof wherein said extension member opens through the outlet port and said inlet member opens through the inlet port.

7. An exhaust insert according to claim 6 wherein said inlet member is flared outwardly such that the inlet port has a larger cross-sectional size than medial portions of said housing.

8. An exhaust insert according to claim 6 further comprising a grill at least partially covering the inlet port.

9. An exhaust insert according to claim 6 further comprising means for supporting the exhaust insert such that said inlet member extends beyond the exhaust port and into the barrel reactor.

10. An exhaust insert according to claim 9 wherein said means for supporting the exhaust insert comprises at least one support flange that is adapted to engage an interior surface of the barrel reactor.

11. An exhaust insert according to claim 10 wherein said support flange comprises a rib extending outwardly from a medial portion of said housing.

12. An exhaust insert according to claim 6 further comprising a lug extending outwardly from said housing for removing the exhaust insert from the exhaust port of the barrel reactor.

13. An epitaxial barrel reactor comprising:

a reaction chamber defining at least one inlet and an exhaust port such that gas can flow therethrough;

a susceptor disposed within said reaction chamber for holding at least one wafer; and an angled exhaust insert that is at least partially inserted into the exhaust port, said exhaust insert comprising a housing having an inlet member and an extension member adapted to be at least partially inserted within the exhaust port, the inlet member being disposed at an angle relative to the extension member so as to support the exhaust insert such that the inlet member extends beyond the exhaust port and into the barrel chamber, said housing also defining inlet and outlet ports at opposed ends thereof wherein the extension member opens through the outlet port and the inlet member opens through the inlet port such that gas is exhausted from said reaction chamber by passing through said exhaust insert and into the exhaust port of said reaction chamber.

14. An epitaxial barrel reactor according to claim 13 wherein portions of the reaction chamber adjacent the exhaust port slope at a predetermined angle relative to the exhaust port, and wherein said inlet member is angled relative to said extension member at a predetermined angle that corresponds to the predetermined angle of slope for portions of the reaction chamber adjacent the exhaust port.

15. An epitaxial barrel reactor according to claim 13 wherein said exhaust insert further comprises a grill at least partially covering the inlet port of said housing.

16. An epitaxial barrel reactor according to claim 13 wherein said reaction chamber defines the at least one inlet such that gas introduced via the at least one inlet is initially directed toward a predetermined side of said reaction chamber, and wherein said exhaust insert is positioned within the exhaust port such that the inlet port of said exhaust insert faces the predetermined side of said reaction chamber in order to received exhaust gases.

17. An epitaxial barrel reactor according to claim 13 wherein said inlet member is flared outwardly such that the inlet port has a larger cross-sectional size than medial portions of said housing.

18. An epitaxial barrel reactor according to claim 13 wherein said exhaust insert further comprises means for supporting said exhaust insert such that said inlet member extends beyond the exhaust port and into said reaction chamber.

* * * * *